United States Patent [19]

French

[11] Patent Number: 5,075,634

[45] Date of Patent: Dec. 24, 1991

[54] COMPOSITE BRIDGE AMPLIFIER

[75] Inventor: John B. French, Stouffville, Canada

[73] Assignee: Blade Technologies Inc., Markham, Canada

[21] Appl. No.: 617,311

[22] Filed: Nov. 23, 1990

[51] Int. Cl.[5] .............................................. H03F 3/217
[52] U.S. Cl. .................................... 330/146; 330/297; 330/10
[58] Field of Search ...................... 330/10, 146, 207 A, 330/251, 277, 297; 332/109

[56] References Cited

U.S. PATENT DOCUMENTS 4,092,610  5/1978  White et al. ..................... 330/146 X
4,484,145  11/1984  Haulin ............................... 330/10 X Primary Examiner—Steven Mottola
Attorney, Agent, or Firm—Rogers, Bereskin & Parr

[57] ABSTRACT

A composite bridge amplifier having four output metal oxide semi-conductor field effect transistors (mosfets) in a bridge configuration. The gates of the mosfets are controlled by an input signal which is amplified in a diamond differential amplifier phase splitter and voltage gain stage and then applied to the mosfet gates. The power terminals (sources and drains) of the mosfets receive a power signal which varies with the input signal at a level sufficient to maintain headroom above the output signal but to reduce power dissipation in the mosfets. The power signal is produced by a switch connected between a floating power supply and a filter and operated at e.g. 200 KHz. The switch is operated by a pulse width modulated (pwm) signal derived from the absolute value of the input signal. Because the power signal in effect tracks the output signal, little power is dissipated in the mosfets so that the amplifier can be made very compact. Because of the bridge configuration, only one switch, one floating power supply and one pulse width modulator are used, reducing cost. Feed forward compensation in the pulse width modulator varies the pulse width of the pulses operating the switch inversely with changes in the power supply voltage, allowing the floating power supply to be unregulated.

16 Claims, 12 Drawing Sheets

COMPOSITE BRIDGE AMPLIFIER

FIELD OF THE INVENTION

This invention relates to an amplifier. The amplifier of the invention is typically an audio amplifier, but it can also be used for other purposes where power amplification of a signal is needed.

BACKGROUND OF THE INVENTION

Push-pull linear amplifiers are commonly used as audio amplifiers. In such amplifiers a great deal of power is usually dissipated across the output transistors. This results in a low efficiency, typically 35 per cent, which is exhibited by most products presently on the market. The large amount of power dissipated (wasted) by the output transistors requires large power supplies, transistors and heat sinks. Such amplifiers are therefore large and require significant ventilation.

Attempts have been made to improve the efficiency of such amplifiers. For example, as disclosed in an article by Harushige Nakagaki et.al. in J. Audio Eng. Soc., Volume 31, No.6, June, 1983 at page 430, the DC voltage supply for an amplifier can be controlled so that it changes in accordance with the input signal. This greatly reduces the power dissipation in the output transistors. However the efficiency of the Nakagaki amplifier is still only 50 per cent, which means that for a 200 watt (output) amplifier, 200 watts must still be dissipated as heat.

Other methods have been used in an attempt to produce more efficient amplifiers. For example switch mode amplifiers have been used, as will be described in more detail presently. These amplifiers are much more efficient than ordinary push-pull linear amplifiers, but they are complex and subject to distortion. It is difficult to achieve high quality audio output signals at a reasonable cost with present switch mode amplifiers.

Bridge audio amplifiers have also been used, as described in a paper by Takahashi et.al., described in J. Audio Eng. Sos., Volume 32, No. 6, June, 1984. Such amplifiers can produce very low distortion, but again they suffer from low efficiency and the need to dissipate substantial power.

SUMMARY OF THE INVENTION

Accordingly, it is an object of the present invention to provide a novel amplifier in which high efficiency can be achieved, but with less cost than a conventional switch mode composite amplifier. In one of its aspects the present invention provides an amplifier for amplifying an input signal, said amplifier comprising:

(a) first, second, third and fourth amplifier means each having first and second power terminals and a control terminal, (b) said amplifier means being connected in a bridge configuration, said first and second amplifier means each having their first power terminals coupled together and to a first power input terminal, said third and fourth amplifier means each having their first power terminals coupled together and to a second power input terminal, (c) the second power terminals of said first and third amplifier means being coupled together and to a first output terminal, the second power terminals of said second and fourth amplifier means being coupled together and to a second output terminal, said first and second output terminals being adapted to being connected to a load, (d) an input terminal for said input signal, and a control circuit coupled between said input terminal and said control terminals of said first to fourth amplifier means to operate alternately said first and third amplifier means and then said second and fourth amplifier means, to direct current from said first power input terminal through said first amplifier means said first output terminal, said load, said second output terminal, said third amplifier means and said second power input terminal, and then to direct current from said first power input terminal through said second amplifier means, said second output terminal, said load, said first output terminal, said fourth amplifier means and said second power input terminal, (e) modulating means coupled to said input terminal for producing a modulated signal having modulation dependent on said input signal, (f) power supply means, and filter means for said power supply means, (g) switch means having a control input, said switch means coupling said power supply means to said filter means, said filter means being coupled to said first and second power input terminals, (h) said modulating means being coupled to said control input of said switch means for controlling said switch means to produce at said power input terminals a power signal dependent on said input signal.

Further objects and advantages of the invention will appear from the following description, taken together with the accompanying drawings.

DETAILED DESCRIPTION OF PREFERRED EMBODIMENT

Figures 1, 2:
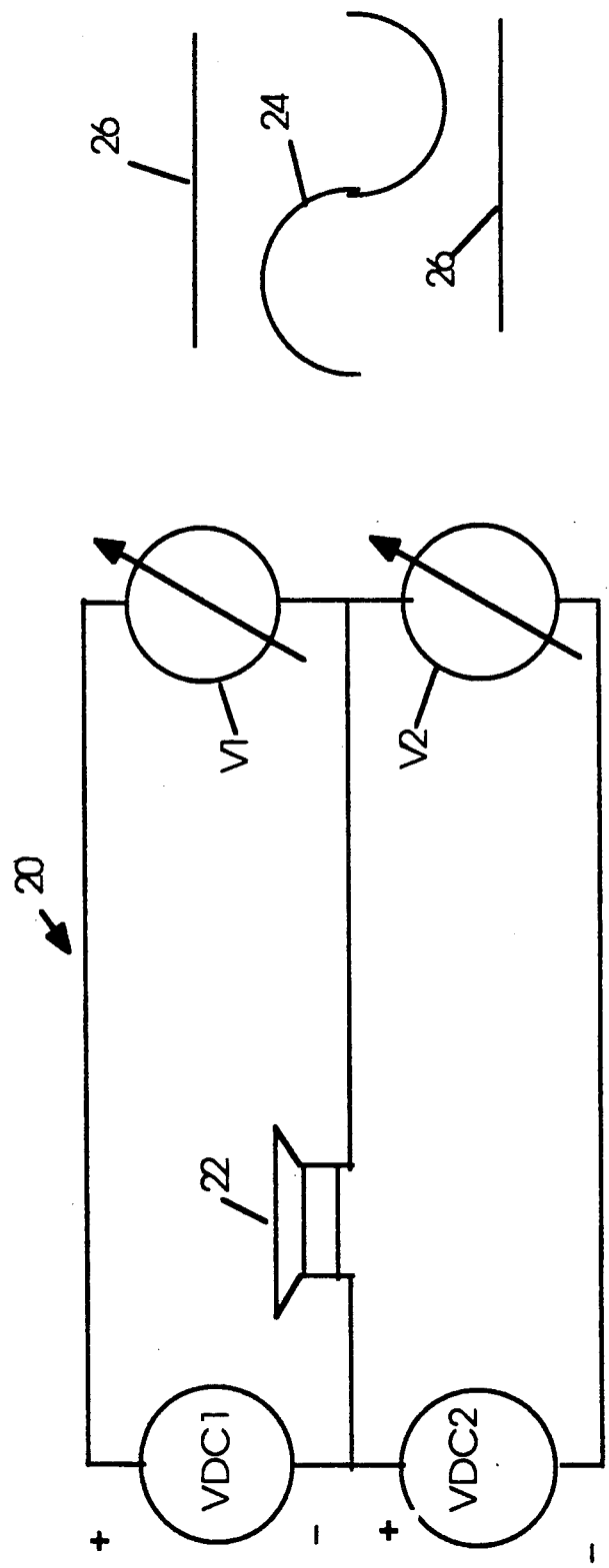
FIG.1 is a block diagram view of a conventional linear push-pull amplifier.
FIG.2 shows waveforms for the FIG.1 amplifier.

Reference is first made to FIG.1, which shows a typical prior art push-pull audio amplifier 20. The amplifier 20 has output transistors indicated by variable voltage sources V1, V2. The sources V1, V2 are in conventional manner responsive to an input signal to achieve the desired output signal across a load 22 (such as a loudspeaker). The sources V1, V2 are powered by two fixed DC supplies VDC1, VDC2 (which need not be regulated so long as sufficient headroom is provided). Each source V1, V2 provides one half of a composite signal 24 (FIG.2) which passes through the load 22.

It will be seen that the difference between the voltage 26 (FIG.2) of the fixed DC supplies VDC1, VDC2 and the signal 24 across the load 22 is dropped across output sources V1, V2. This voltage difference, multiplied by the current through each device V1, V2, results in high power which must be dissipated across the output sources V1, V2. This results in the typical low efficiency referred to previously. Such efficiency can in fact be as low as 30% depending on the applicable conditions.

Figure 3:
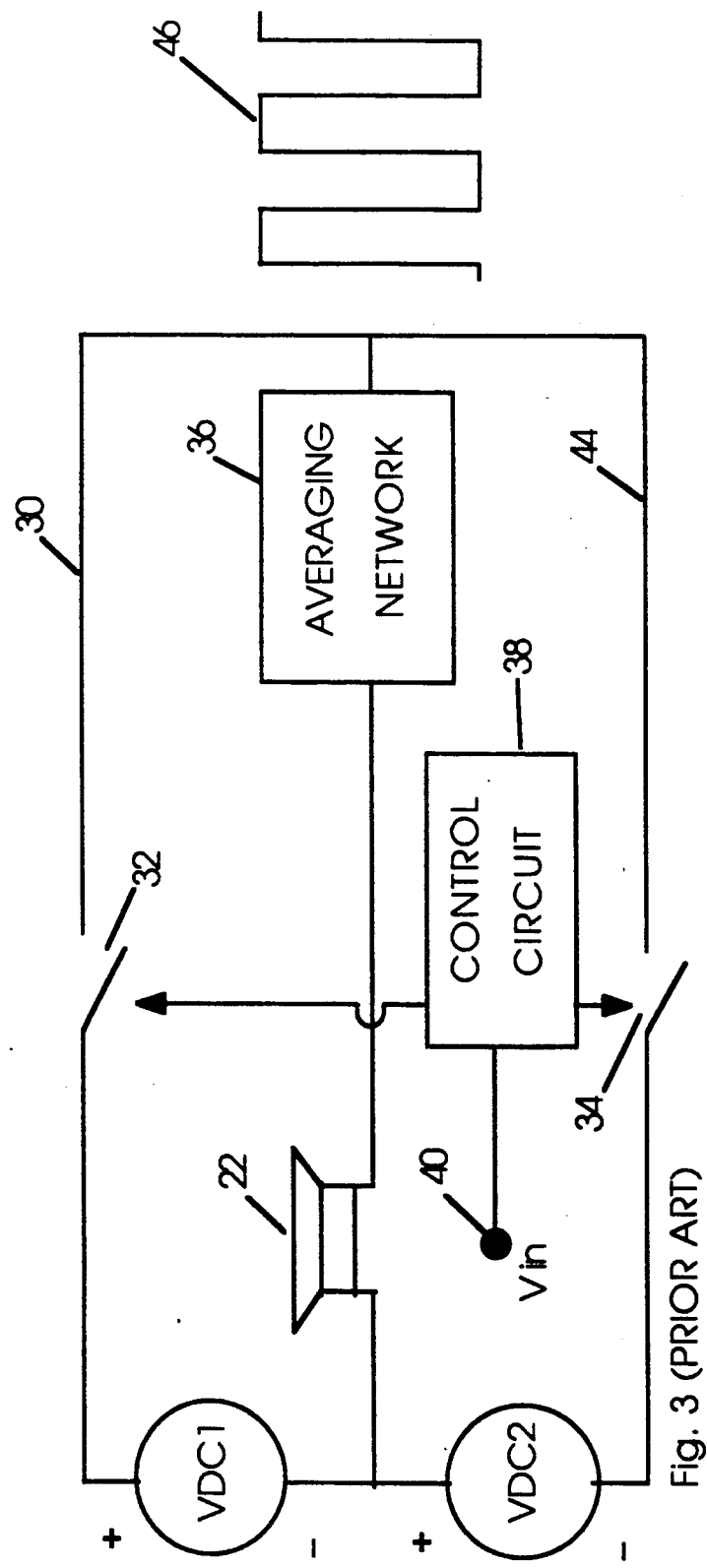
FIG.3 is a block diagram view of a conventional prior art switch mode amplifier (Class D)

Reference is next made to FIG.3, which shows a prior art bilateral class D switch mode amplifier 30. Corresponding reference numerals indicate parts corresponding to those of FIG.1. The FIG.3 amplifier 30 was developed for improved efficiency. Amplifier 30 again has fixed DC supplies VDC1, VDC2, the outputs of which are directed through switches 32, 34 and then through an averaging network 36 to load or speaker 22. The switches 32, 34 are controlled by a control circuit 38 which responds to an input signal Vin (e.g. an audio signal to be amplified) at its input terminal 40.

The switches 32, 34 are (in the case of audio and higher bandwidth amplifiers) typically metal oxide semiconductor field effect transistors (mosfets). Switches 32, 34 open and close to produce a pulse width modulated DC signal in each of branches 42, 44, with the duty cycle of the pulses tracking the input signal Vin. Switch 32 could be opened and closed for positive excursions of the input signal and switch 34 could open and close for negative excursions of the input signal. However this creates crossover distortion which is difficult to remove, and it also makes it difficult to provide a stable control loop. Therefore bilateral switching is normally used. For bilateral switching, the switches 32, 34 alternately open and close simultaneously at a frequency which is typically 200 to 500 KHz (for audio applications). The resultant pulse width modulated (pwm) signal is indicated at 46 in FIG.3. For zero input signal, each switch is open and closed for 50 per cent of each cycle and the resultant signal 46 is filtered so that the average signal produced by the averaging network 36 is zero. For a positive going signal, switch 32 would be open longer in each cycle than switch 34. (Other control methods are also available.) This method improves crossover distortion. However with the method shown in FIG.3, it is difficult to achieve high quality audio output signals (less than 1.0 per cent distortion) at reasonable cost, even though the efficiency of the amplifier is high. In particular, it is inevitable that effective closure of the switches 32, 34 will not be at exactly the correct times (depending on board layout, stray capacitances, inductance and noise). Therefore switch mode amplifiers have not found wide acceptance as high quality audio amplifiers.

Figure 4:
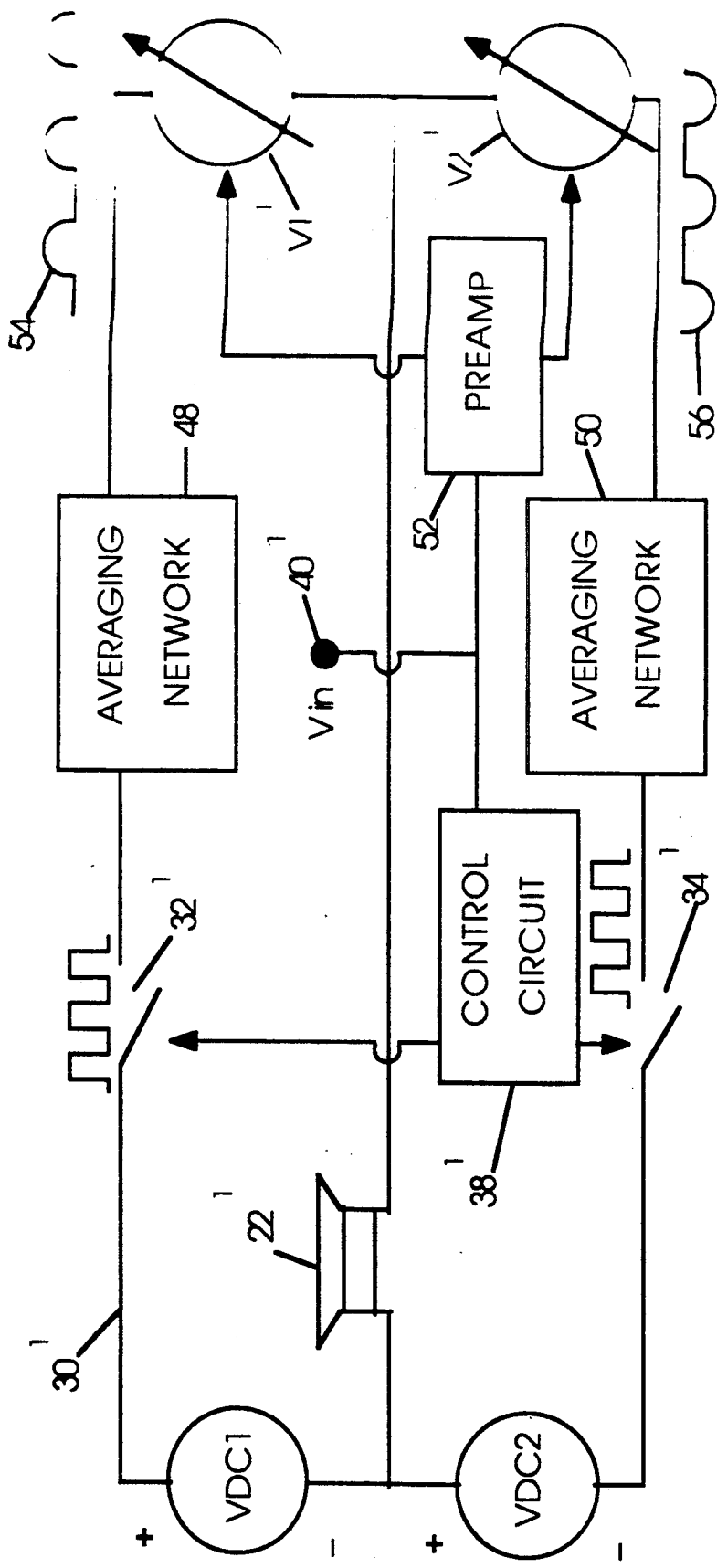
FIG.4 is a block diagram view of a typical prior art push-pull composite amplifier.

Another known form of switch mode amplifier, sometimes called a "push-pull composite amplifier", is shown in FIG.4 in which primed reference numerals indicate parts corresponding to those of FIGS.1 and 3. A major difference between FIGS.3 and 4 is that two averaging networks or filters 48, 50 have been used in place of one, the output of such averaging networks being used to power output transistors represented as controlled voltage sources $V1^1$ $V2^1$. The output signal Vin is preamplified by preamplifier 52 and used to control sources $V1^1$, $V2^1$. Switches $32^1$, $34^1$ are pulse width modulated by control block $38^1$ to produce, at the outputs of networks 48, 50, positive and negative DC signals 54, 56 respectively which are only slightly higher than the output signal. The result is situation similar to that shown in the Nakagaki et al paper (supra), i.e. the DC voltage which powers the output sources $V1^1$, $V2^1$ varies to maintain only a small amount of "headroom" or difference between such voltage and the output signal. Because of the small difference between the output signal and the outputs of the averaging networks 48, 50, the voltages dropped across sources $V1^1$, $V2^1$ are small. The result is high efficiency, and also higher than class D signal quality. However the circuit of FIG.4 is very expensive since it requires not only two voltage sources and two switches, but also two averaging networks and two switch controls.

Figure 5:
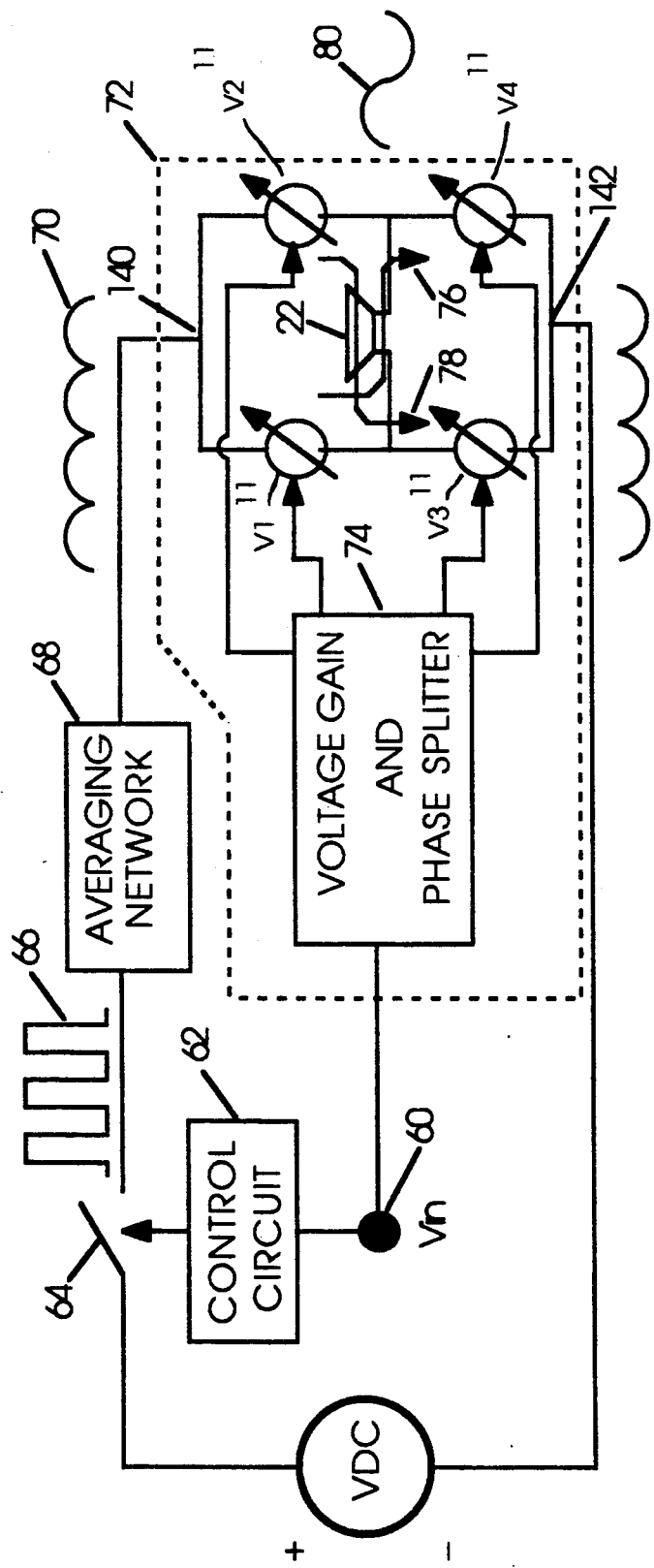
FIG.5 is block diagram view of an amplifier according to the present invention.

Reference is next made to FIG.5, which shows an amplifier according to the invention, represented in form similar to that used in FIGS. 1 to 4. In FIG.5 the input signal Vin at input terminal 60 controls a control circuit 62 which supplies a pwm signal (corresponding to Vin) to switch 64. A single DC power supply VDC feeds its output through the switch 64, producing a pwm power signal 66 which is averaged by averaging network or filter 68, producing an averaged or filtered signal 70 which corresponds to Vin.

The signal 70 is used to power a bridge amplifier 72. Bridge amplifier 72 includes four output transistors shown as controllable voltage sources $V1^{11}$, $V2^{11}$, $V3^{11}$, $V4^{11}$ driving a load or speaker 22. Bridge amplifier 72 is controlled by the input signal Vin, which is phase split and preamplified by gain stage 74 (forming part of the bridge amplifier) and then directed to sources $V1^{11}$ to $V4^{11}$. The bridge amplifier 72 is essentially two push-pull amplifiers driven 180 degrees out of phase from each other. On one half cycle of each signal, sources $V1^{11}$, $V4^{11}$ are on and current flows through the load 22 as indicated by arrow 76. On the other half cycle sources $V2^{11}$, $V3^{11}$, are on and current flows through the bridge as indicated by arrow 78. The result is the composite output wave form 80 through the load $22^{11}$.

The configuration shown in FIG.5 has the advantage that because of the polarity reversing properties of the bridge 72, only one DC supply VDC1, one control circuit 62, and one pwm switch 64 are needed. This considerably reduces the cost, notwithstanding the added complexity of the bridge. In addition, the use of the bridge can have advantages in reducing distortion. The FIG.5 circuit can be made very compact, even for high power applications.

While the FIG.5 circuit will normally be used to drive audio speakers, it can also be used for precision motor control, high quality inverters, and any other applications where accurate and efficient power amplification of an input signal is required.

Figure 6:
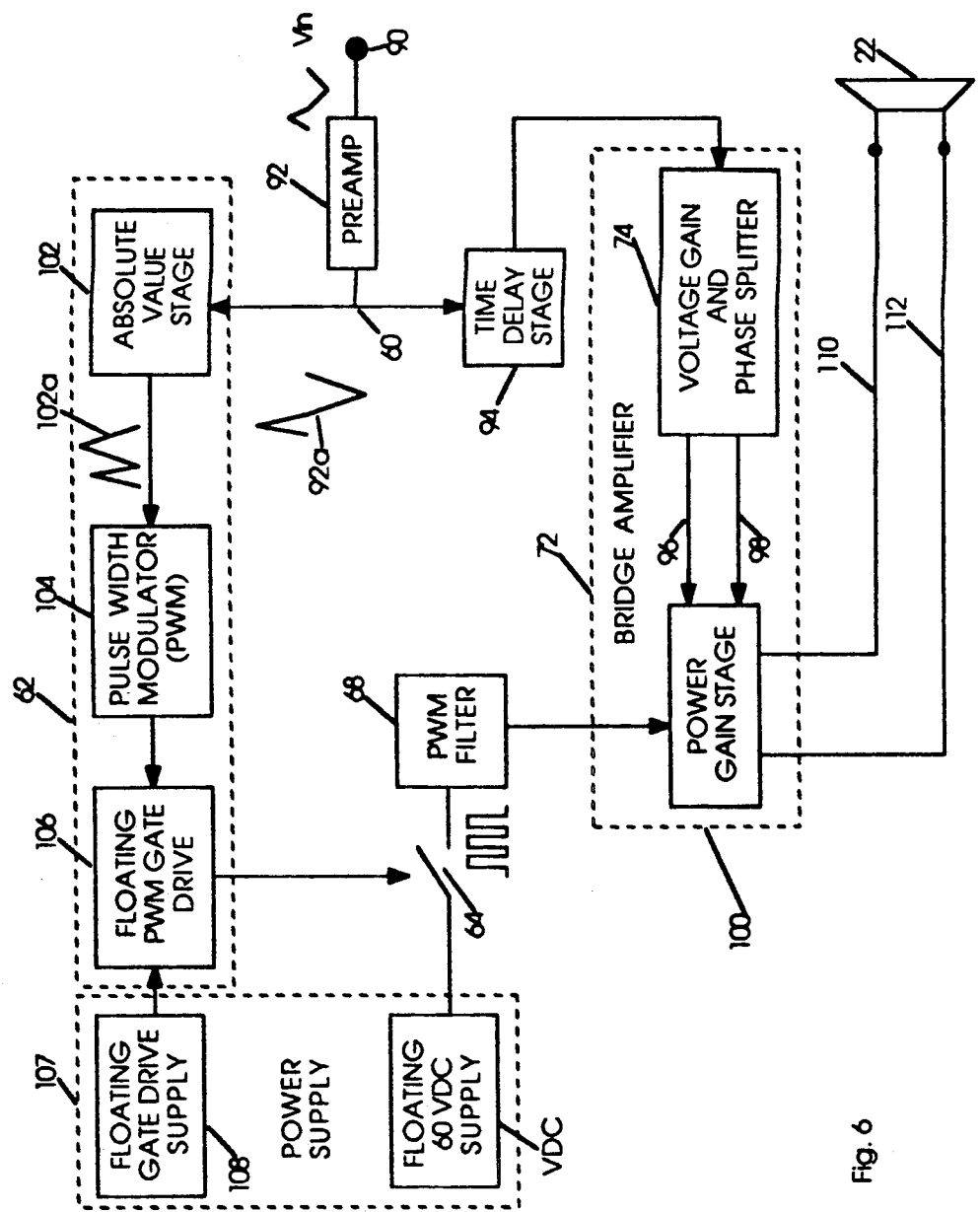
FIG.6 is a more detailed block diagram of the amplifier of FIG.5.

Reference is next made to FIG.6, which shows a more detailed block diagram of a circuit according to the present invention. Corresponding reference numerals are used to indicate corresponding parts in FIGS.5 and 6.

In FIG.6, the input signal at system input terminal 90 is directed to a preamplifier 92. The output 92a of the preamplifier 92 is split at terminal 60. Firstly, the output of the preamp 92 passes through a time delay stage 94

(the purpose of which will be described presently). From stage 94 the signal passes to the voltage gain stage/phase splitter stage 74 where it is phase split and amplified to control the controllable voltage sources or output transistors $V1^{11}$ to $V4^{11}$. From stage 74 the split phase signal is directed via leads 96, 98 to the power gain stage 100 which includes sources $V1^{11}$ to $V4^{11}$.

The other part of the preamplified signal is directed to the control circuit 62. As shown, the control circuit includes an absolute value stage 102 which provides a fully rectified (absolute value) form 102a of the input signal. This signal is directed to a pulse width modulator stage 104, the output of which is a pwm signal corresponding to the input signal Vin. The pwm signal is directed to a floating pwm gate drive stage 106, which operates the switch 64. Power for the pwm gate drive stage 106 is supplied by a power supply 107 having floating gate drive power supply portion 108.

The switch 64 connects a floating 60 volt DC power supply VDC (also part of power supply 108) to the averaging network or pulse width modulator filter 68. The switch 64 provides to the filter 68 a pwm signal proportional to the input signal Vin. The filter 68 averages this signal and directs it to the power gain stage 100 as will be described in more detail. The output of the power gain stage appears on leads 110, 112.

A feature of the system shown in FIG.6 is that the output voltage of the time variant DC source constituted by supply VDC, switch 64 and filter 68, is kept essentially at a constant ratio to the output of the bridge 72. This assists in realizing the principal advantage of the composite amplifier of FIG.6, namely high efficiency.

Two other advantages result from the choice of control method shown in FIG.6. Firstly, the "headroom" for the bridge (i.e. the difference in voltage between the supply voltage to each source $V1^{11}$ to $V4^{11}$ and the output voltage of each device $V1^{11}$ to $V4^{11}$) is proportional to the output signal of the amplifier. This is ideal for the mosfet power transistors used (as will be described) for sources $V1^{11}$ to $V4^{11}$. Because of their resistive nature, mosfets require headroom proportional to the current passed through them, which in the case of the bridge is proportional to the output signal.

Secondly, the control method used is (as will be described in more detail) open loop. This means that control loop stability, often a problem associated with pwm systems, is greatly simplified.

Figure 7:
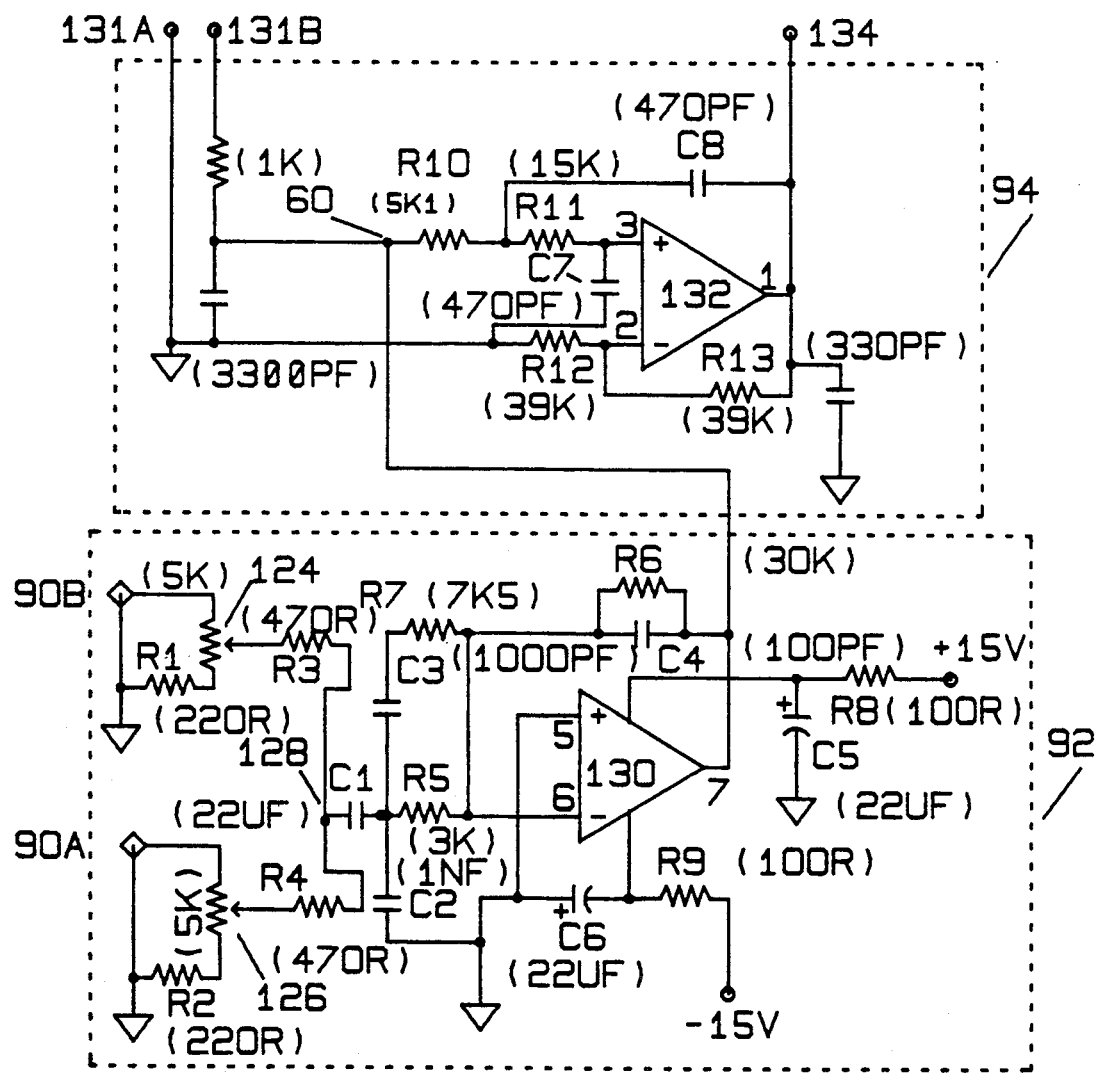
FIG.7 is a schematic of the preamplifier and time delay stages of FIG.6.

Reference is next made to FIGS. 7 and following, which show a detailed circuit according to the invention. In the schematics, component values are shown in parentheses. Integrated circuit pin numbers are shown next to the IC's.

PREAMPLIFIER 92 (FIG.7)

The preamplifier 92 is shown in FIG.7. As shown, the input signal Vin can be input through either or both of input terminals 90a, 90b allowing for summed mono operation. The input signal can be attenuated using potentiometers 124, 126, the maximum attenuation being set by resistors R1, R2. Resistors R3, R4 sum the two inputs at terminal 128. Coupling to amplifier 130 is provided by capacitor C1 and resistor R5. Capacitors C2, C3 provide filtering of the signal. Resistor R6 is a feedback resistor. Capacitor C4 provides the preamplifier dominant pole role-off. An RC network consisting of resistor R7 and capacitor C3 across resistor R5 raises the gain of the preamplifier by 2.9 dB above 21 KHz compensating for the roll-off introduced by the time delay stage 94. The maximum gain of the preamplifier is set by R6/R5 at 20 dB. Resistors R8, R9 and capacitors C5, C6 provide filtered positive and negative rails for the preamplifier. These rails are indicated as +15v. and −15v. respectively and are derived from power supply 107.

The output of the preamplifier appears at terminal 60 to be fed to the time delay stage 94. From terminal 60 it is also directed to terminals 131a, 131b from which it passes to the absolute value stage 102.

TIME DELAY STAGE 94 (Fiq.7)

The time delay stage 94, also shown in FIG.7, includes an amplifier 132. The signal at output terminal 60 is connected to pin 3 of amplifier 132 via resistors R10, R11. (Amplifiers 130, 132 may be two halves of the same device.) The other input pin 2 of amplifier 132 is connected through resistor R12 to ground, and also through resistor R13 to output pin 1. The other end of resistor R12 is connected through capacitor C7 to pin 3. Capacitor C8 is a feedback capacitor. Resistors R10, R11 and capacitors C7, C8 are chosen to give approximately a seven microsecond delay. The gain of the time delay stage is 1+R13/R12 or 6dB. The circuit has a constant gain up to 18 KHz.

The output of the time delay stage 94 appears at pin 1 of amplifier 132 and is directed to output terminal 134 which is connected to the bridge amplifier 72. The time delay step is needed because the pwm filter 68 (FIG.6) uses a low pass filter (as will be described) which produces an effective group delay of the signal. The time delay stage 94 thus aligns the input signal to the bridge with the power signal to the bridge.

The bridge amplifier 72 will next be described.

BRIDGE AMPLIFIER 72 (FIG. 8)

Figure 8:
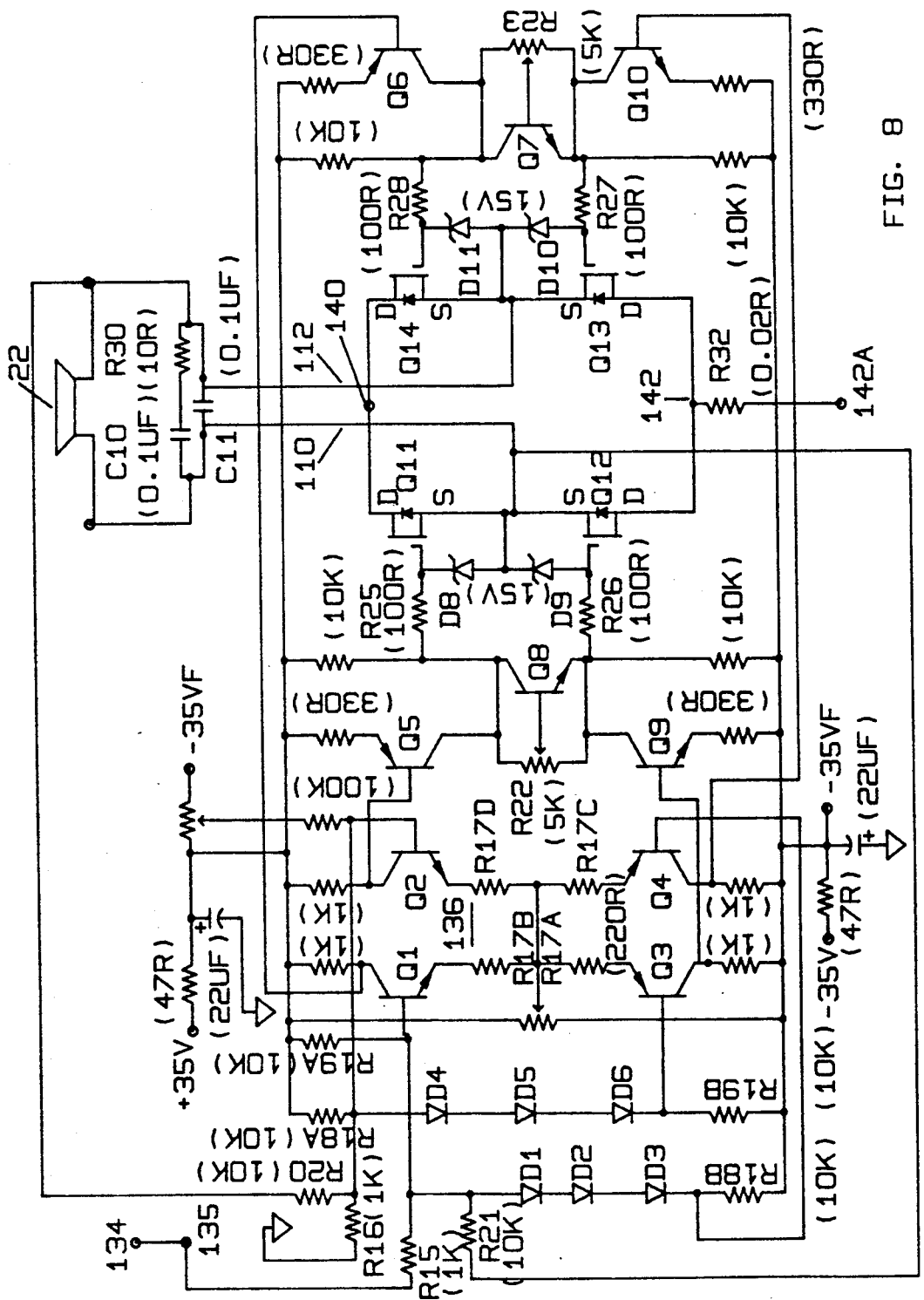
FIG.8 is a schematic of the bridge amplifier of FIG.6.

The bridge amplifier 72 is shown in FIG.8 and is generally organized as follows. The voltage gain or phase splitter stage 74 includes a diamond differential amplifier 136 having transistors Q1, Q2, Q3 and Q4. This is required since the bridge mosfet output transistors (to be described) are simply power gain transistors and do not provide voltage gain, and they also require two relatively large signals 180 degrees out of phase from each other to drive them. While other arrangements than the diamond differential amplifier 136 could be used for the output transistor drive, differential amplifier 136 gives a fully balanced or symmetric output which helps to avoid distortion and reduce transient intermodulation distortion. The differential amplifier 136 and following voltage gain stage also reduce noise introduced by separate grounds of the power source and signal ground of the amplifier.

The output of the differential amplifier 136 is voltage amplified by transistors Q5, Q6, Q9 and Q10. The output of these latter transistors is used to drive the mosfet power output transistors Q11 to Q14. Transistors Q11 to Q14 serve as sources $V1^{11}$ to $V4^{11}$ previously described.

In more detail, the signal from time delay stage output terminal 134 is received at terminal 135 and is directed through input resistors R15, R16 to the bases of transistors Q1, Q2. The signal at the base of transistor Q1 is also applied through diodes D1, D2, D3 to the base of transistor Q4. The signal applied to the base of transistor Q2 is also applied through diodes D4, D5, D6 to the base of transistor Q3. Bias current through the differential amplifier 136 is set by the diode drops D1 to D3 and D4 to D6 less the transistor Vbe drops divided by the resistance of resistor R17. Base current and diode bias current is provided by resistors R18A, R18B, R19A, R19B.

In operation, if for example the input signal at the base of Q1 goes high, Q1 turns on and its collector goes low. This turns on Q6 harder so the collector of Q6 goes high. This turns on bridge output transistor Q14, so that the output voltage of the bridge on lead 112 goes up, as will be described.

At the same time, the base of transistor Q4 goes high, turning off Q4. Since point 138 always stays at about zero volts because of the various current flows in the differential amplifier 136, therefore the collector of Q4 goes low, driving the base of Q10 low. Q10 then turns off and its collector goes high, turning off bridge output transistor Q13, as desired.

The same operation applies to transistors Q2, Q3. When Q3 turns on, Q2 turns off. As Q2 turns off, its collector goes high, turning off Q5. The collector of Q5 then goes low, turning off Q11, so that the negative output lead 110 of the bridge goes low.

When Q3 turns on, the base of Q9 goes high, so that the Q9 collector goes low. This turns on Q12 as desired.

The bridge output transistors Q11 to Q14 are connected as shown to output leads 110, 112 which in turn are connected to the load 22. The DC supply voltage for transistors Q11 to Q14 is supplied at positive and negative terminals 140, 142, from the pwm filter 68 (not shown in FIG.8). As indicated by the body diodes in Q11 to Q14, transistors Q11 and Q14 are N-channel, while transistors Q12 and Q13 are P-channel.

The current flows through the bridge are as follows.

In most cases, power flows from positive power input terminal 140 (see also FIG.5) which is connected to the pwm filter (as will be described). Power returns to the pwm filter from negative power input terminal 142 (see also FIG.5). In one half cycle of the input signal Vin, current flows from terminal 140 through Q11 drain to source, through the output lead 110, load 22 and lead 112, then from the source to drain of Q13, and then to the negative terminal 142 of the pwm filter 68. In the other half cycle current flows from terminal 140 through transistor Q14 drain to source, through output lead 112, load 22, lead 110, transistor Q12 source to drain, and then to terminal 142 of the pwm filter 68.

The gain of the bridge is set by negative feedback resistors R20, R21 (connected between each side of the load and the bases of Q1 to Q4), divided by input resistors R15, R16. (In the embodiment shown the gain is 20 dB). The negative feed back resistors R20, R21 reduce distortion and noise and produce more stable gain.

Bias current in the output transistors Q11, Q12 and Q14, Q13 is set by R22, Q8, and R23, Q7 respectively. These ensure that some bias current will be kept flowing, during crossover, through the output transistors.

Diodes D8, D9, D10, D11 protect the gates of transistors Q11 to Q14 from over voltage. Resistors R25 to R28 help ensure high frequency stability by reacting with the input capacitances of Q11 to Q14. Capacitor C10 and resistor R30 help dampen output instability by ensuring a resistive load at high frequencies. Capacitor C11 suppresses very high frequency noise on the output. Resistor R32 senses the current flowing in the bridge for an over current detection and protection circuit (not shown). Power for the voltage gain stage and phase splitter is provided by positive and negative rails shown as +35v. and −35v., derived from power supply 107 (FIG.6).

It will be noted that the power level in the diamond differential amplifier 136 and in the following amplifier Q5, Q9, Q6, Q10 is quite low (only a few watts). Therefore the inefficiency of this amplifier dissipates little power. In addition, the power supplies are typically unregulated and may vary slightly with the load, but the circuit is not sensitive to this and in fact rejects such variation, as will be explained.

ABSOLUTE VALUE STAGE 102 (FIG.9)

The absolute value stage 102 simply provides rectification, the input signal at terminal 131a being shown at 145a and the output signal at terminal 146 being shown at 145b. The absolute value stage 104 includes two amplifiers 147, 148 (typically two halves of one device) connected as shown. In operation, assume a positive going signal at input resistor R35 which is connected to input pin 2 of amplifier 147. Pin 2 of amplifier 147 will always be at ground because of feedback through resistors R36, R37, and diodes D15, D16 so the output at pin 1 of amplifier 147 will go negative to draw current from input resistor R35 to keep pin 2 at ground. Current then flows through resistor R37. Diodes D15, D16 perform rectification and prevent current from flowing in the opposite direction. Pin 1 of amplifier 147 then goes negative. This provides a negative signal at pin 6 of amplifier 148. Amplifier 148 then acts as an inverting amplifier with the gain of 1, thus giving a positive going signal at its output pin 7, i.e. at output terminal 146.

Figure 9:
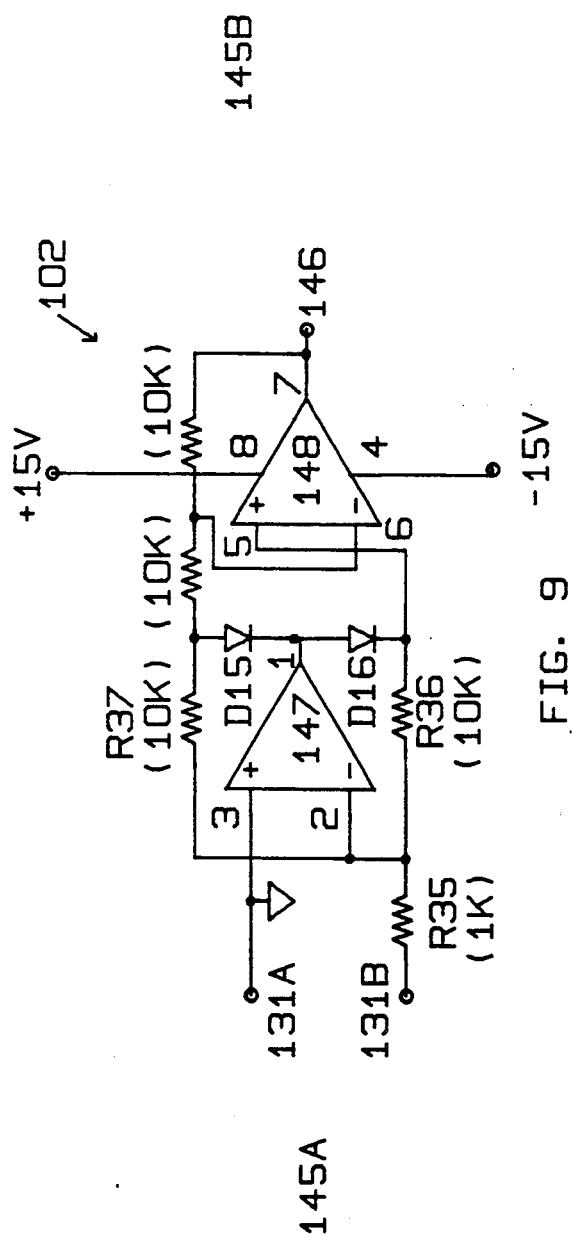
FIG.9 is a schematic of the absolute value stage of FIG.6.

Next assume that there is a negative going input signal at resistor R35. This causes current to flow into pin 2 of amplifier 147. Therefore current flows through diode D16 and resistor R36, and the output pin 1 of amplifier 146 goes positive to supply this current. This causes pin 5 of amplifier 148 to go positive. Pin 6 of amplifier 148 is at ground, so amplifier 148 now becomes a non-inverting amplifier or buffer. The result is full wave rectification. The technique used in FIG.9 is well known for full wave rectification of small audio signals. While a diode bridge could be used, such bridge would subtract 1.4 volts from the signal, which would in most cases eliminate the signal.

Figure 10:
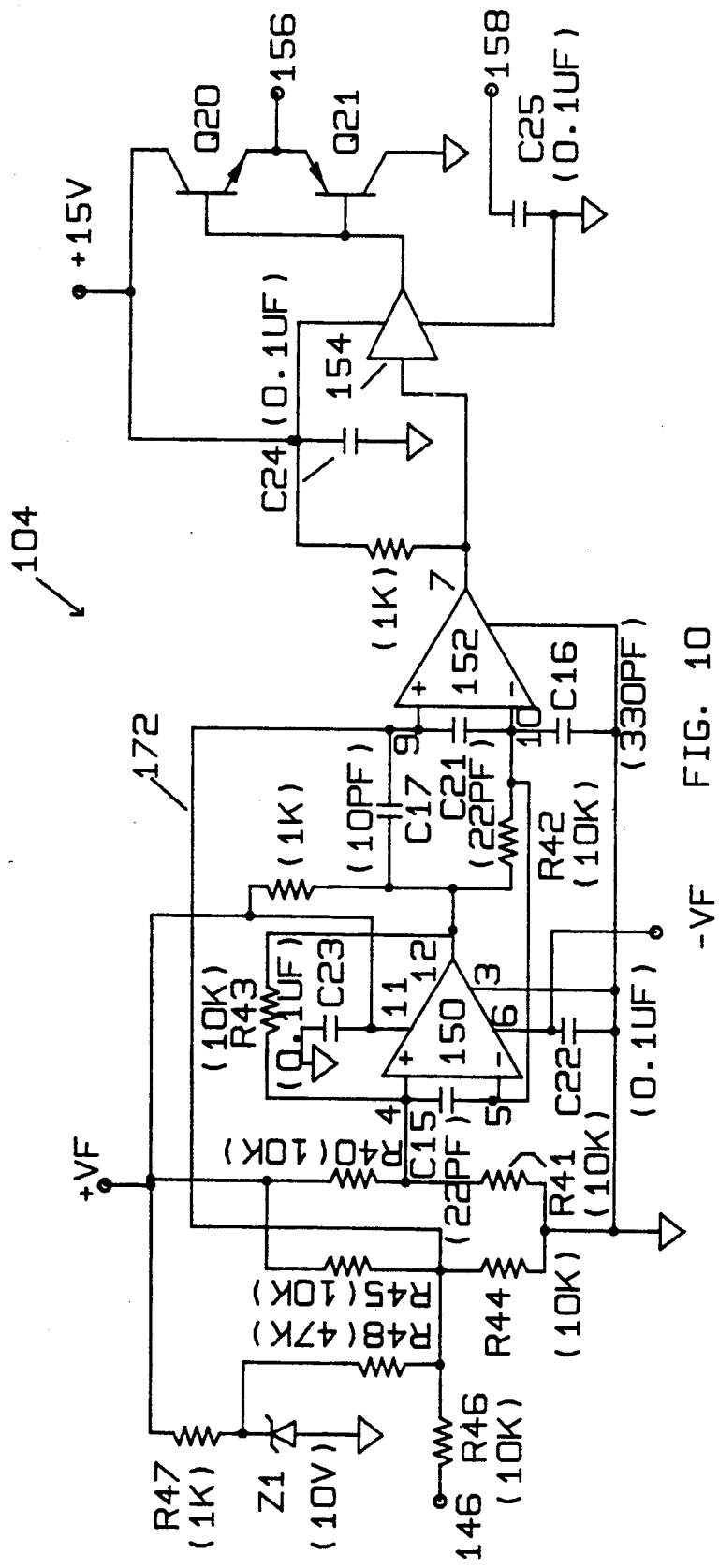
FIG.10 is a schematic of the pulse width modulator of FIG.6.

The output at terminal 146 from the absolute value stage 102 is directed to the pwm circuit 104, shown in FIG. 10.

PWM CIRCUIT 104 (FIG.10)

The pwm circuit 104 includes two comparators 150, 152 (typically two halves of one device) connected as shown. The output at pin 7 of comparator 152 is connected to a buffer amplifier 154, the output of which is in turn connected to a voltage follower amplifier consisting of transistors Q20, Q21. The output of pwm circuit 104 appears at terminals 156, 158.

Figure 11:
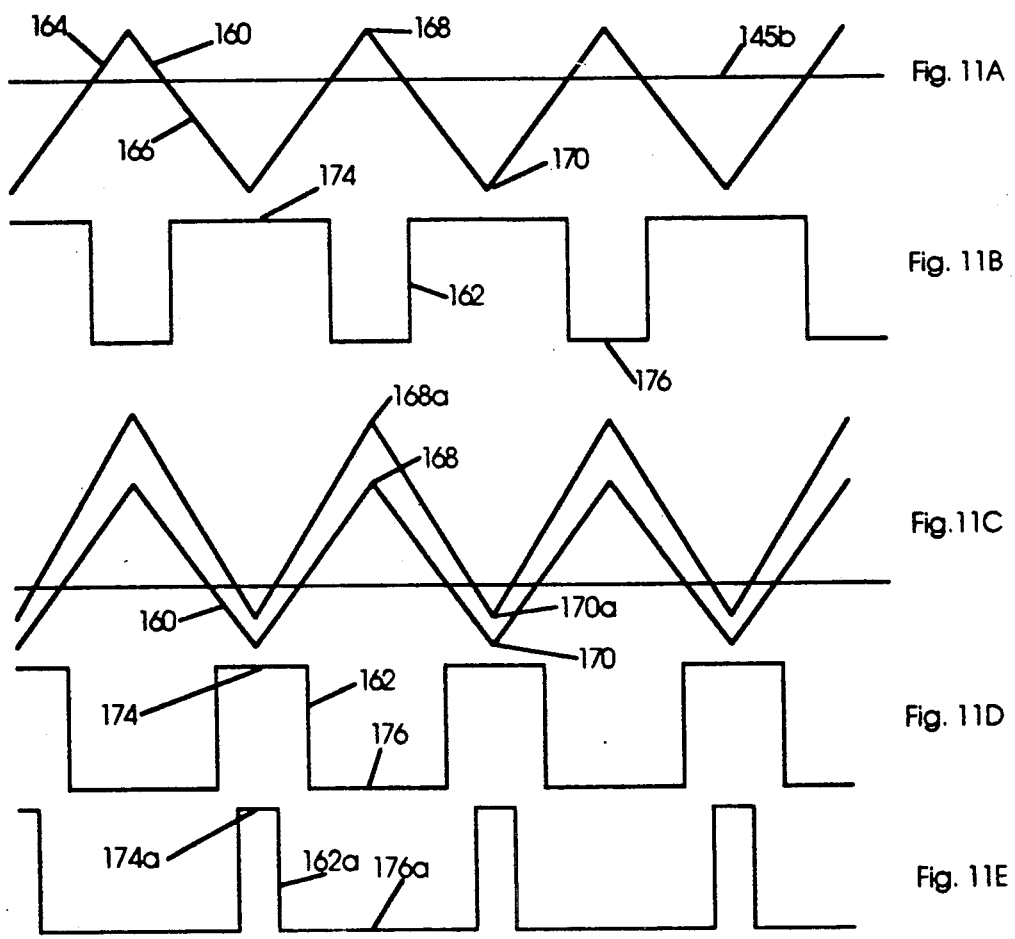
FIG.11A, 11B, 11C, 11D and 11E show wave forms for the pulse width modulator of FIG.10.

In the pwm circuit 104, a triangular wave 160 (FIG.-11A) of e.g. 200 KHz is created by comparator 150. The triangular wave 160 is produced at pin 10 of comparator 152 and is compared by comparator 152 with the control signal 145b (FIGS. 9, 11A) from the absolute value stage 102. The output of comparator 152 is a pwm signal 162 (FIG.11B).

Comparator 150 generates the triangular wave 160 as follows. Its positive input pin 4 is connected through resistor R40 to the positive supply +VF and through resistor R41 to ground. Pin 4 of comparator 150 is also connected through capacitor C15 to negative input pin 5 of comparator 150. Pin 5 is in turn connected through resistor R42 to output pin 12 and through capacitor C16 to ground. Resistor R43 is connected between input and output pins 4, 12.

In operation, comparator 150 compares the voltages at its input pins 4, 5. If the voltage at input pin 4 is above or below that at input pin 5, the output at pin 12 will be high or low respectively.

Assume that the output at pin 12 is high. Then because of the voltage divider formed by resistors R40 and R43 in parallel and connected to +VF, and resistor R41 connected to ground (and since all these resistors are 10 K), the voltage at pin 4 will be $\frac{2}{3}$ of +VF (e.g. 10 volts DC). Voltages +VF and −VF are derived from power supply 107 (FIG.6). The suffix "F" is used simply to emphasize that the power supply is filtered but unregulated. Capacitor C16 now charges through resistor R42 and the voltage at pin 10 rises, i.e. the triangular wave climbs as indicated at 164 in FIG.11A. The voltage at pin 10 appears directly at input pin 5 of comparator 150.

When the voltage at output pin 10 (and hence pin 5) reaches and passes $\frac{2}{3}$ of +VF it now exceeds the voltage at input pin 4. The comparator 150 then causes pin 12 to go low (i.e. ground). Resistor R43 now effectively is placed in parallel with resistor R41, acting together as a voltage divider with resistor R40. Therefore, the voltage at input pin 4 of comparator 150 drops to $\frac{1}{3}$ of +VF (e.g. 5 volts if +VF is 15 volts). Since the voltage on pin 12 of comparator 150 is zero, this draws current out of capacitor C16, so that the voltage on C16 and hence at pins 10 and 5 falls. The triangular wave is now falling, as shown at 166 in FIG.11A. When this voltage falls below $\frac{1}{3}$ of +VF, i.e. below that at pin 4, output pin 12 goes high and the cycle begins again.

It will be noted that the upper and lower limits 168, 170 of triangular wave 160 are not fixed voltages, but rather are proportional to the input voltage supply +VF. This is a useful feature. In an amplifier, the DC input power tends to track the input signal, i.e. as the input signal becomes smaller, the DC input power becomes smaller. Conversely, when the DC battery power drain goes up, the DC source voltage (if not regulated, and regulation is expensive) usually tends to fall. As will be explained, these two factors tends to cancel in the pwm circuit 104 of FIG.10.

The triangular wave produced at pin 10 by comparator 150 is compared with the output 145b of the absolute value stage 102 in comparator 152. Specifically, the control signal 145b from the absolute value stage 102 is firstly centred with respect to the triangular wave by passing signal 145b through a network consisting of resistors R44, R45, R46. These resistors, all 10k as shown, centre control signal 145b between $\frac{1}{3}$ and $\frac{2}{3}$ of +VF. Resistor R48 adds a small DC offset, to ensure that when the output 145b from the absolute value stage 102 is zero, there will always be some output at pin 7 of comparator 152 (for a reason to be explained shortly. To ensure that the DC offset is constant and does not vary with the power supply, a 10 volt zener diode Zl is provided.

The control signal 145b from the absolute value stage 102, centred as described, appears via lead 172 at pin 9 of comparator 152. Comparator 152 acts as does comparator 150, driving its output pin 7 high or low when the voltage at its input pin 9 is higher or lower respectively than that at input pin 10. The result of the comparison with the triangular wave of FIG 11A is shown in FIG. 11B. As shown when the control signal voltage at pin 9 exceeds the voltage of the triangular wave at pin 10 the output at pin 7 of comparator 152 will be high as shown at 174. When the control signal at pin 9 is less than the triangular wave at pin 10, the output voltage at pin 7 of comparator U6B will be low as shown at 176.

If the control signal 145b is near the bottom of the triangular wave 160, then the pwm output signal 162 is mostly low. However the DC offset previously described helps to ensure that there will always be some output signal 162.

FIG.11C illustrates the situation when the supply voltage +VF changes. For example assume that +VF is initially 15 volts and rises to 18 volts. In that case the triangular wave form 160 which originally has its upper and lower peaks 168, 170 at 10 volts and 5 volts respectively shifts as shown at 160a so that its upper and lower peaks 168a, 170a are at 12 volts and 6 volts respectively.

The pwm output signal 162 at pin 7 of comparator 152 for the 5 to 10 volt triangular wave 160 is shown at 162 in FIG.11D. It will be seen that the high pulses 174 are relatively wide. For the 6 to 12 volt triangular wave 160a, the output pwm wave is shown at 162a in FIG.116 and it will be seen that the high pulses 174a are now narrower. Thus, when the supply voltage goes down, the pulse width increases. Since the average output of the pulse width modulator 104 is voltage times pulse width, the power output is maintained constant even when the battery voltage falls. This is a form of feed forward compensation.

It may be possible under some conditions to drive the FIG.10 circuit to a condition in which the output pin is always high or low (for brief periods). This possibility, which would cause severe distortion, is eliminated by capacitor C17, which is connected between output pin 12 of comparator 150 and input pin 9 of comparator 152. Assume that pin 9 is just greater than two thirds of +VF. One would then expect the output at pin 7 always to be high. However the output from pin 12 of comparator 150 is a square wave running from high to low to high. When pin 12 goes low, the low transmitted through capacitor C12 pulls pin 9 briefly slightly below +VF, creating a momentary pulse at pin 7 to maintain some output. Conversely, assume that the voltage at pin 9 is slightly below $\frac{1}{3}$ of +VF (which is unlikely because of the DC offset). Then, when pin 12 goes high, it will pull pin 9 slightly above $\frac{1}{3}$ of +VF, again giving a slight pulse at output pin 7. This ensures that the pwm circuit 104 never shuts fully off. This is important because the outputs 156, 158 at the pwm circuit 104 are connected to the following circuit 106 through a transformer (as will be explained) and the transformer passes only AC.

The voltage follower transistors Q20, Q21 of the pwm circuit 104 provide up to 500 ma current capability.

Capacitors C15 and C21 connected across the inputs of comparator 150, 152 provide noise suppression. Capacitors C22, C23 provide local decoupling. Capacitor C24 is a bypass capacitor, while capacitor C25 provides AC coupling for the transformer in the pwm gate drive circuit 106 which will next be explained.

PWM GATE DRIVE 106, SWITCH 64 AND PWM FILTER 68 (FIG.12)

Figure 12:
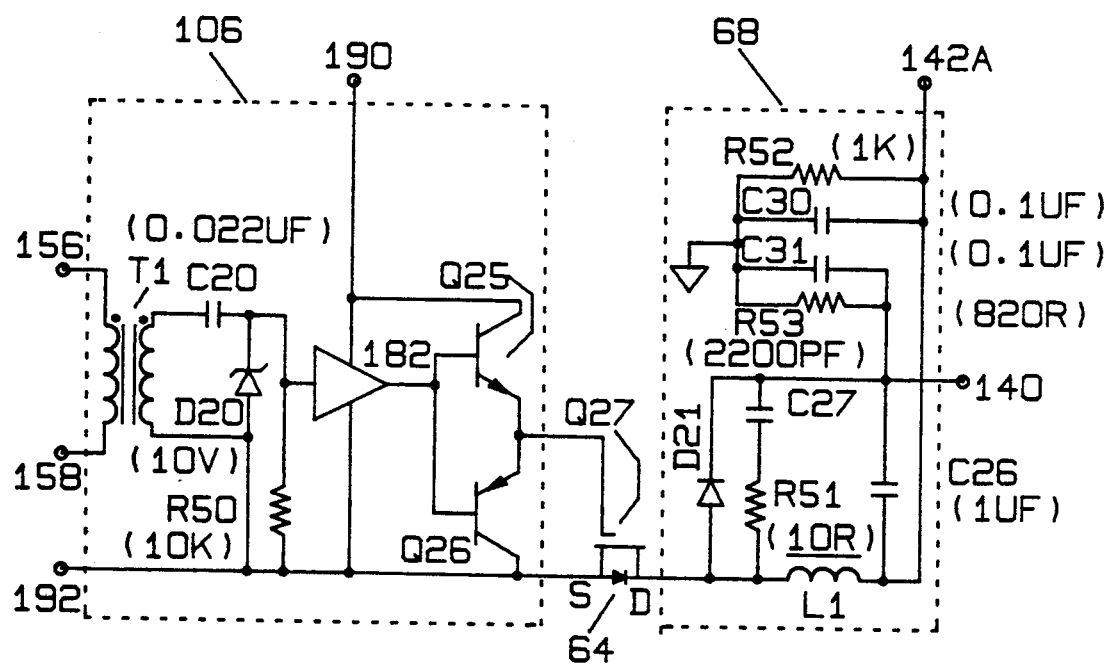
FIG.12 is a schematic of the floating pwm gate drive, switch, and pwm filter of FIG.6.

Reference is next made to FIG.12, which shows the pwm gate drive circuit 106, the switch 64 and the pwm filter 68. Specifically, the pulse train 162 from the pwm 104 is directed through transformer T1. Capacitor C29 and diode D29 provide DC recovery for the signal in the secondary of transformer T1, i.e. they ensure that the signal will have excursions between preset DC limits regardless of its duty cycle. The signal from capacitor C30 is directed through another buffer amplifier 182. Resistor R50 bleeds off DC voltage which might otherwise be integrated at the input of amplifier 182.

The output of buffer amplifier 1822 is directed to voltage follower amplifier Q25, Q26. The emitters of these transistors are tied together and to the gate of mosfet Q27, which constitutes the switch 64.

The output from Q27 is averaged in the pwm 68 by diode D21, inductor L1, and capacitor C26. Inductor L1 and capacitor C26 low-pass filter the pulse train from mofset switch Q27. Diode D21 provides a path for the current flowing in inductor L1 when Q27 is off. Capacitor C27 and resistor R51 reduce the reverse recovery noise caused by diode D21. The voltage on capacitor C26 will be the average of the pulse train unless the load current becomes so small that the current in inductor L1 becomes discontinuous. In that event the voltage on capacitor C26 will begin to climb to the peak value of the pulse train. This non-linearity is removed from the amplifier output signal by the bridge stage.

If there were no output at pin 7 of comparator 152, then there would be no pulse train passing through transformer T1. The switch or mosfet Q27 would then turn off completely, and the output of the time variant power source, and hence of the bridge, would drop to zero. If this occurred at a crest of the input signal waveform, severe distortion would occur. For this reason the circuit ensures, as described, that there is always some output at pin 7 of comparator 152 (FIG.10).

The output of the pwm filter or averaging network 68 appears at terminals 140, 142a. Terminal 140 is the positive power input terminal 140 for the bridge output transistors as shown inn FIG. 8. Terminal 142a is connected to the negative power input terminal 142 of the bridge output transistors, as also shown in FIG.8. Resistors R52, R53 connected between terminals 140, 142a and ground centre the output of the pwm filter 68 with respect to ground.

Resistor R53 is less than R52 to compensate for the current drawn by the over-current detection circuit (not shown). Capacitor C30, C31 bypass noise to ground.

The amplifier 182 and transistors Q25, Q26 in FIG.12 are powered by +15v. at terminal 190 from the floating gate drive power supply 108. This voltage floats, i.e. it is not referenced to ground. The other side of floating gate power supply 108 is connected to terminal 192 in FIG.12.

The floating 60 volt DC supply VDC (FIG.6) has its negative side connected to terminal 192 in FIG.12 and its positive side connected to terminal 140 in FIG.12. Thus the negative side is completely floating, but the positive side is referenced to the bridge supply since it is connected to the drains of bridge output transistors Q11, Q14.

Figure 13:
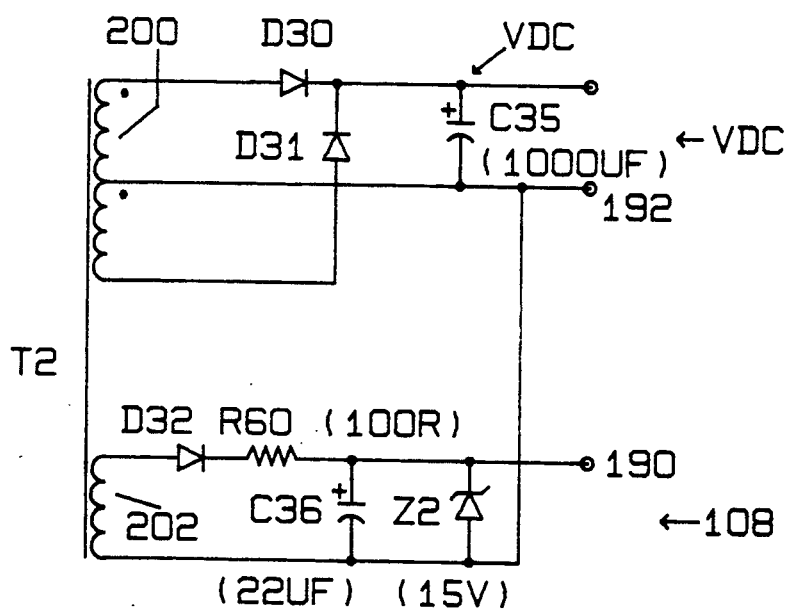
FIG.13 is a schematic of part of the power supply for the FIG.6 circuit.

The floating 60 volt DC supply VDC is shown in FIG.13. This supply includes one secondary winding 200 of a transformer T2 (other secondary windings, not shown, of transformer T2 supply other voltages for the amplifier). The voltage from winding 200 is rectified by diodes D30, D31, filtered by capacitor C35, and applied to terminals 140, 192 of FIG.12. Another secondary winding 202 of transformer T2 provides the floating 15 volt supply 108 for the gate drive. The waveform from winding 202 is peak detected by diode D32 and capacitor C36. Zener diode Z2 shunt regulates the voltage on C36. Resistor R60 lowers the RMS current in C36. The output of circuit 108 is applied to terminals 190, 192 in FIG.12.

It will be seen that in the embodiment described, only one pwm time variant DC power supply is needed, i.e. there is a need only for one absolute value stage 102, one pwm stage 104, one floating pwm gate drive 106, one switch 64 and one pwm filter 68. This single combination of elements can be used for both halves of the bridge AC signal because of the polarity reversing properties of the bridge.

Measurement performed on a prototype of the amplifier described showed that it achieved a typical efficiency of 75% with 0.2% total harmonic distortion.

While a preferred embodiment has been described, it will be appreciated the various modifications can be made and are within the scope of the appended claims. For example, while pulse width modulation has been described and is preferred, other forms of modulation may be used, e.g. pulse position modulation, frequency modulation, burst modulation, and phase modulation.

With respect to the parts shown in the drawings, unless otherwise stated, all diodes are 1N4148, all resistors are ¼ watt 5%, all non-electrolytic capacitors are ceramic, 'X7R' dielectric, 5 or 10%. The remaining parts are as follows:

| Designation | Description | Manufacturer Part No. | Manufacturer |
| --- | --- | --- | --- |
| 130,132, 147,148 | Op-Amp | NE5532AP | Texas Inst. |
| 150,152 | Comparator | LM319N | National Semi. |
| 154,182 | Buffer | CD4050BCP | National Semi. |
| Q1,Q2, Q7,Q8, Q20,Q25 | NPN Signal | 2N4401 | Motorola |
| Q3,Q4, Q21,Q26 | PNP Signal | 2N4402 | Motorola |
| Q5,Q6 | PNP Signal | MPSA56 | Motorola |
| Q9,Q10 | NPN Signal | MPSA06 | Motorola |
| Q11,Q14, Q27 | Mosfet N-ch | IRF540 | Internat. Rect. |
| Q12,Q13 | Mosfet P-ch | IRF9540 | Internat. Rect. |
| D21 | Ultrafast diode | MUR840 | Motorola |
| D30,D31 | Ultrafast diode | GI2404 | General. Inst. |
| D20,Z1 | Zener diode | 1N5240B | Motorola |
| D8,D9, D10,D11, Z2 | Zener diode | 1N5245B | Motorola |
| C26 | Metal film | 2222-368-25105 | Phillips |
| L1 | 22 uH | | |
| R1,R2, R22,R23 | 5K Pot | 3386S-102-502 | Bourns |
| R30 | 10 R ¼ Watt 5% | | |
| R52 | 1 k ¼ watt 5% | | |
| R51 | 10 R 1.6 Watt 5% | | |
| R32 | 0,02 R 3 Watt 5% | | |

I claim:

1. An amplifier for amplifying an input signal, said amplifier comprising:
   (a) first, second, third and fourth amplifier means each having first and second power terminals and a control terminal,
   (b) said amplifier means being connected in a bridge configuration, said first and second amplifier means each having their first power terminals coupled together and to a first power input terminal, said third and fourth amplifier means each having their first power terminals coupled together and to a second power input terminal, (c) the second power terminals of said first and third amplifier means being coupled together and to a first output terminal, the second power terminals of said second and fourth amplifier means being coupled together and to a second output terminal, said first and second output terminals being adapted to being connected to a load, (d) an input terminal for said input signal, and a control circuit coupled between said input terminal and said control terminals of said first to fourth amplifier means to operate alternately said first and third amplifier means and then said second and fourth amplifier means, to direct current from said first power input terminal through said first amplifier means, said first output terminal, said load, said second output terminal, said third amplifier means and said second power input terminal, and then to direct current from said first power input terminal through said second amplifier means, said second output terminal, said load, said first output terminal, said fourth amplifier means and said second power input terminal, (e) modulating means coupled to said input terminal for producing a modulated signal having modulation dependent on said input signal, (f) power supply means, and filter means for said power supply means, (g) switch means having a control input, said switch means coupling said power supply means to said filter means, said filter means being coupled to said first and second power input terminals, (h) said modulating means being coupled to said control input of said switch means for controlling said switch means to produce at said power input terminals a power signal dependent on said input signal.

2. An amplifier according to claim 1 and including time delay means coupled between said input terminal and said control circuit for ensuring that the operation of said first to fourth amplifier means by said control circuit is synchronized with said power signal.

3. An amplifier according to claim 1 wherein said modulating means is a pulse width modulating means and modulated signal is a pulse width modulated signal.

4. An amplifier according to claim 3 wherein said pulse width modulating means includes means coupled to said input terminal for producing an absolute value signal having an absolute value proportional to the absolute value of said input signal, and means for deriving said pulse width modulated signal from said absolute value signal.

5. An amplifier according to claim 1, 3 or 4 wherein said power supply means is floating relative to ground.

6. An amplifier according to claim 1, 3 or 4 wherein said amplifier includes only one said switch means and only one said pulse width modulating means.

7. An amplifier according to claim 3 wherein said pulse width modulating means includes means coupled to said input terminal for producing an absolute value signal having an absolute value proportional to the absolute value of said input signal, and means for deriving said pulse width modulated signal from said absolute value signal, said means for deriving said pulse width modulated signal including second power supply means coupled to said first mentioned power supply means for supplying a voltage, means coupled to said second power supply means for generating a triangular wave having upper and lower limits proportional to the voltage supplied by said second power supply means, said triangular wave having a frequency much greater than that of said input signal, and means for comparing said absolute value signal with said triangular wave to produce a pulse width modulated signal having pulses of width dependent on the time during which said absolute value signal exceeds in a predetermined direction said triangular wave, so that the width of said pulses will vary with variations in the voltage supplied by said second power supply means.

8. An amplifier according to claim 7 wherein said means for generating said triangular wave comprises a comparator having an output terminal and first and second input terminals, and means for comparing the voltage at said input terminals and for producing a high at said output terminal when said voltage at said first input terminal exceeds that at said second input terminal and for producing a low at said output terminal when the voltage at said first input terminal is less than that at said second input terminal, a resistor connected to said output terminal, a capacitor connected to said resistor, so that said capacitor will charge through said resistor when said output terminal is high and will discharge through said resistor when said output terminal is low, said resistor and capacitor being connected at a junction and said junction being connected to said second input terminal, said first input terminal being connected through a second resistor to said output terminal and through a third resistor to a source of positive voltage of said second power supply means and through a fourth resistor to a source of negative voltage of said second power supply means, said third and fourth resistors forming with said second resistor a voltage divider between said sources of positive and negative voltage, so that when said output is high, said second resistor is effectively in parallel with said third resistor to set an upper limit for said triangular wave and when said output is low said second resistor is effectively in parallel with said fourth resistor to set a lower limit for said triangular wave.

9. An amplifier according to claim 1 wherein said control circuit includes a differential amplifier for receiving said input signal, said differential amplifier including means for dividing said input signal into two opposite phase signals and for amplifying each of said opposite phase signals.

10. An amplifier according to claim 9 wherein said control circuit includes further amplifier means connected between said differential amplifier and the control inputs of said first to fourth amplifier means for amplifying said different phase signals and for directing the resultant amplified signals to said control inputs of said first to fourth amplifier means.

11. An amplifier according to claim 10 wherein said first to fourth amplifier means are each metal oxide semiconductor field effect transistors (mosfets).

12. An amplifier according to claim 11 wherein the mosfets of said first and second amplifier means are of opposite polarity from those of said third and fourth amplifier means.

13. An amplifier according to claim 11 wherein the mosfets of said first and second amplifier means are N-channel and the mosfets of said third and fourth amplifier means are P-channel.

14. An amplifier according to claim 1, 2, or 3 and being an audio amplifier, said load being a loudspeaker.

15. An amplifier according to claim 8 wherein said means for comparing said absolute value signal with said triangular wave includes circuit means for producing a pulse train even when the absolute value signal does not exceed said triangular wave or always exceeds said triangular wave, and drive means including an input transformer for receiving said pulse width modulated signal and for producing a drive signal for said switch means.

16. An amplifier according to claim 15 wherein said switch means comprises a metal oxide semi-conductor field effect transistor.

* * * * *